(12) United States Patent
Snure et al.

(10) Patent No.: US 11,361,999 B1
(45) Date of Patent: Jun. 14, 2022

(54) STRESS-INDUCED SELECTIVE-AREA LIFT-OFF OF THIN FILMS AND DEVICES ON VAN DER WAALS BUFFER LAYERS

(71) Applicant: Government of the United States, as represented by the Secretary of the Air Force, Wright-Patterson AFB, OH (US)

(72) Inventors: Michael R. Snure, Oakwood, OH (US); Eric W. Blanton, Dayton, OH (US); Jeff L. Brown, Fairborn, OH (US); Albert M. Hilton, Centerville, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/142,068

(22) Filed: Jan. 5, 2021

(51) Int. Cl.
*H01L 21/78* (2006.01)
*H01L 21/683* (2006.01)

(52) U.S. Cl.
CPC ...... *H01L 21/7806* (2013.01); *H01L 21/6836* (2013.01); *H01L 2221/68368* (2013.01)

(58) Field of Classification Search
CPC ............. H01L 21/7806; H01L 21/6836; H01L 2221/68368
USPC .......................................................... 438/22
See application file for complete search history.

(56) References Cited

U.S. PATENT DOCUMENTS

| | | | |
|---|---|---|---|
| 8,247,261 B2 | 8/2012 | Bedell et al. | |
| 9,040,432 B2 | 5/2015 | Bedell et al. | |
| 9,058,990 B1 | 6/2015 | Bayram et al. | |
| 9,064,698 B1 | 6/2015 | Khakifirooz et al. | |
| 9,236,271 B2* | 1/2016 | Bayram | H01L 21/6836 |
| 9,570,295 B1* | 2/2017 | Bedell | H01L 33/44 |
| 9,653,554 B2* | 5/2017 | D'Evelyn | C30B 23/025 |
| 10,205,018 B1* | 2/2019 | Li | H01L 29/6656 |
| 10,504,722 B2 | 12/2019 | Snure et al. | |

OTHER PUBLICATIONS

Ayari, T., et al., Novel Scalable Transfer Approach for Discrete III-Nitride Devices Using Wafer-Scale Patterned h-BN/Sapphire Substrate for Pick-and-Place Applications, Adv. Mater. Technol. 2019, 4, 1900164.

* cited by examiner

*Primary Examiner* — Vu A Vu
(74) *Attorney, Agent, or Firm* — AFMCLO/JAZ; Timothy M Barlow

(57) ABSTRACT

A method for making a selective-area lift-off thin film comprises depositing a van der Waals (vdW) buffer on a substrate; depositing a thin film material (or device structure) on the van der Waals buffer; depositing an adhesion layer on the thin film material; forming a stressor layer on top of the thin film layer; and bonding a handle layer to the stressor layer. Force may be applied to the layered structure by one or more of rolling, bending, and shearing. The area selected for lift-off may be defined by one of laser cutting and mechanical scribing. The vdW buffer includes one or more of hBN, graphite, and graphene. The handle layer is a one of a polyimide tape, thermal release tape, UV release tape, water- or solvent-soluble tape, Kapton tape, and Scotch tape. The stressor layer is a metal film, e.g. Ni, Cr, Ti.

10 Claims, 4 Drawing Sheets

STRESS-INDUCED SELECTIVE-AREA LIFT-OFF OF THIN FILMS AND DEVICES ON VAN DER WAALS BUFFER LAYERS

RIGHTS OF THE GOVERNMENT

The invention described herein may be manufactured and used by or for the Government of the United States for all governmental purposes without the payment of any royalty.

FIELD OF THE INVENTION

The present invention relates generally to methods for selective lift-off and transfer of selected areas from a host substrate and, more particularly, to methods for making such structures incorporating van der Waals release layers.

BACKGROUND OF THE INVENTION

Integrating ultra-thin layers and devices consisting of different materials on a single platform or substrate is of interest for producing integrated circuits for various optical, electrical, medical, and military applications. Combining many different technologies on a single platform or substrate can achieve performance and functionality not achievable by monolithic integration. Therefore, methods to lift-off and transfer selected areas, features, and devices from a host substrate are desired in order to enable pick-and-place type integration.

SUMMARY OF THE INVENTION

The present invention overcomes the foregoing problems and other shortcomings, drawbacks, and challenges of making structure which permits selective lift-off and transfer of selected areas from a host substrate. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a method for making a selective-area lift-off thin film, comprises depositing a van der Waals (vdW) buffer on a substrate; depositing a thin film material (or device structure) on the van der Waals buffer; depositing an adhesion layer on the thin film material; forming a stressor layer on top of the thin film layer; and bonding a handle layer to the stressor layer.

According to a first variation, the method further comprises applying a force to the layered structure by one or more of rolling, bending, and shearing.

According to another variation, the method further comprises defining a selected area for lift-off by one of laser cutting and mechanical scribing.

According to a further variation, vdW buffer includes one or more of hBN, graphite, and graphene. The handle layer may be a one of a polyimide tape, thermal release tape, UV release tape, water- or solvent-soluble tape, Kapton tape, and Scotch tape. The stressor layer is a metal film, e.g. nickel. The thin film material may be a device structure. The thin film material may be one or more of GaN, AlN, InN, GaAs, GaP, and InP. The adhesion layer may be one or more of Ni, Cr, and Ti. The device structure is one or more of a transistor, LED, diode, solar-cell, capacitor, inductor, resistor, photonic devices, and wave guides.

According to a second embodiment of the invention, a selective-area lift-off thin film structure, comprises a van der Waals (vdW) buffer layer on a substrate; a thin film material on the van der Waals layer; an adhesion layer on the thin film material; a stressor layer on top of the thin film layer; and a handle layer to the stressor layer.

This invention describes a method for selectively removing and transferring patterned areas of a thin film or devices from a substrate, as well as a stacked structure made by the disclosed method.

First, a van der Waals (vdW) buffer is deposited on a substrate material, e.g. sapphire. A thin film material or structure is deposited on the van der Waals buffer, e.g. hBN (hexagonal boron nitride), graphene, graphite, and others. An adhesion layer is deposited on the thin film or structure. Then a stressor layer is formed on top of the thin film, which will induce mechanical separation or lift-off from the substrate at the weak vdW interface once a crack is initiated. A handle, e.g. tape, may be applied to the stressor layer as the top layer of the stacked structure. Selected regions of the stacked structure may then be defined on the surface through laser cutting or mechanical scribing. The crack boundary may then be initiated in order to define the selected regions, and the defined regions are selectively removed from the surface. The thin film or structure may be deposited by metal organic chemical vapor deposition, chemical vapor deposition, molecular beam epitaxy, sputtering, and pulsed laser deposition. The vdW layer may also be transferred from another growth substrate.

These methods may be used to integrate the selectively-removed devices and films onto substrates that may not be compatible with aggressive deposition and processing conditions, e.g. polymers, metals, and glasses. Methods based on selective etching, laser damage, and mechanical separation have been demonstrated, including selective chemical etching of epitaxial layers known as epitaxial lift-off, laser lift-off and Ni-spalling (mechanical).

One form of mechanical separation involves depositing films on the vdW buffer layers, e.g. hBN (hexagonal boron nitride), graphite, or graphene, $MoSe_2$, $WSe_2$, and mica, bonding a mechanical handle, e.g. tape, to the top of the stacked structure, and applying a force. The force may be applied by rolling, bending, or shearing in order to induce cleaving at the weak bonds between layers in the vdW buffer and to cause separation at the interface, e.g. between two vdW layers, a vdW layer and the substrate, or the vdW layer and the film. The handle may be used to lift off large continuous films and selected regions. Tape may include thermal release, UV release, water- or solvent-soluble, Kapton, and Scotch. Thermal release, Kapton or water-soluble tapes were most common used.

The new lifted-off films may be applied to not just crystalline semiconductor layers, but also, insulators, metals, 2D layers, amorphous layers, and polycrystalline layers. It can be applied to blanket films or fully processed devices.

Alternatively, mechanical separation may be achieved by applying a stressor layer on top of the film of the device layer to be lifted off, and initiating a crack in a process known as controlled spalling. The stressor layer is commonly a metal film, e.g. Ni, deposited by sputtering. The spalling process may be used to separate films from various sources including bulk substrates, e.g. Si, Ge, GaAs, GaP, thin film heterostructures, and films on vdW (van der Waals) buffer layers. Both mechanical separation methods are suitable for lift-off of large areas but have limited versatility for selective and patterned lift-off. The thin film heterostructures are layers of films of different materials where one of the layers is mechanically weaker than the other, so that when spalling is performed the mechanical separation occurs at this mechanically-weaker layer. The use of these thin film heterostructures is similar in concept to the use of the weak vdW layer. Both act as a preferential release layer. Prior demonstrations of selective-area lift-off using a vdW buffer require defining and patterning areas prior to depositing the film or device structure. This may be done by etching away or masking regions of the vdW buffer, which will leave an inhomogeneous film across the deposition substrate. For device processing, this will reduce usable area and require additional alignment and processing steps.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
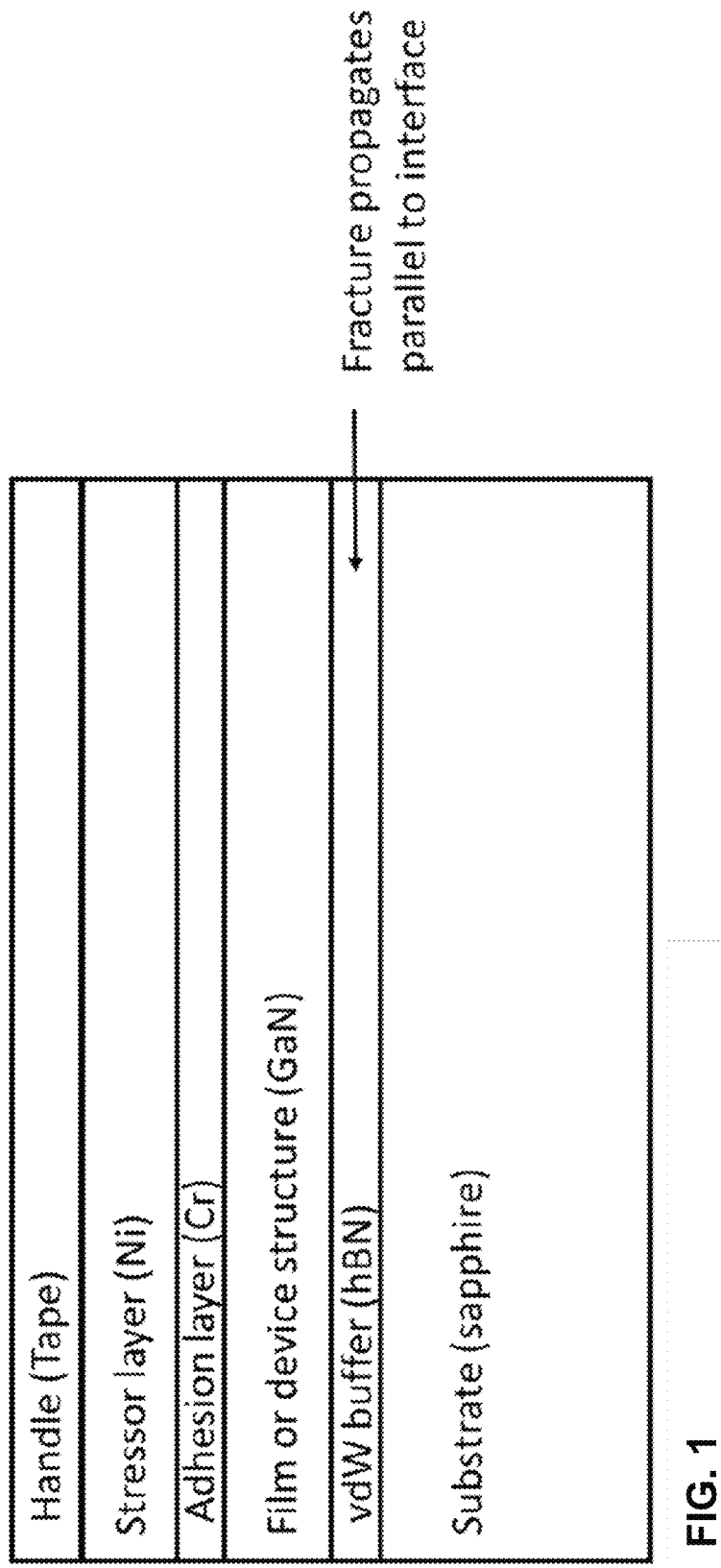
FIG. 1 presents a sectional view of a transfer structure.

This invention describes the selective separation of thin film areas or devices from a substrate. A thin film or structure of interest, e.g. a device or multilayer/heterostructure film is deposited or transferred onto a vdW buffer layer, such as hBN, graphite, or graphene, by methods including, but not limited to, chemical vapor deposition, physical vapor deposition, liquid deposition, dry transfer, wet transfer, or a combination of techniques. Electrical, optical, or other devices may then be processed and formed from these thin film layers. A stressor layer may then be deposited to cover the film or device wafer. A handle such as a polyimide tape or thermal release tape is applied on top. The stressor layer serves to propagate fracture or spalling parallel to the surface once the crack is initiated. When spalling a layer from a homogenous brittle substrate, the depth of the fracture is controlled by the thickness and stress of the stressor layer. The depth may also be controlled by creating a step in the substrate prior to deposition of the stressor layer. Alternatively, the depth may be set by the use of a weak mechanical layer such as the vdW buffer used here. The vdW buffer ensures fracture occurs at the interface between two vdW layers, a vdW layer and the substrate, or the vdW layer and the film (FIG. 1). The crack may be initiated by applying a force on the handle by bending or peeling away from the substrate, or by laser cutting or mechanical scribing.

Selective removal of a defined area from a continuous film may be achieved by the crack definition step. Using a mechanical scribe, laser cutting, or other method, the area to be lifted off may be defined by scribing, cutting, etc. down to the vdW buffer (FIG. 2). This step allows for selection of the area or patterned area bound by the cutting or scribing process. With a handle layer selectively placed over this region the fracture may be initiated. The handle may be placed over the whole structure and cut/scribed, or the handle may be placed only in the selected area. Both are possible. As to the former, the handle is placed covering the whole structure and then cut through, as to the latter, the cut is made and then the handle is put on top and only the selected area is removed. The selected area may then be lifted from the substrate or device wafer. The layer may then be transferred to a new substrate and bonded using direct vdW or adhesive bonding. After lift-off and bonding, the handle and stressor may then be removed. Alternatively, the handle and stressor layer may be removed prior to bonding to a new substrate.

FIG. 1 shows a schematic of the layered transfer structure comprising a growth substrate, e.g. sapphire, SiC, Si, Ge, GaAs, Sift/Si, quartz, a vdW buffer, and a deposited film. In one example, the deposited film structure is GaN grown on a few-layer thick hBN vdW buffer layer grown by metal organic chemical vapor deposition (MOCVD) on sapphire. On the GaN surface a thin (2 to 50 nm thick) chromium (Cr) adhesion layer is deposited by e-beam evaporation. Then a Ni stressor layer (500 nm to 12 microns thick) is deposited by sputtering. The sputtering pressure and power are used to control stress in the layer from 200 MPa to 500 MPa. The layers to be transferred are not limited to GaN but may include AlN, InN, GaAs, GaP, InP, ZnO, $Ga_2O_3$, $Al_2O_3$, $WSe_2$, $MoSe_2$, etc. and may be grown by MOCVD or other chemical, physical, or liquid epitaxial growth methods. The vdW buffer may include graphene, $MoS_2$, or other layered vdW materials either deposited on the substrate, not limited to sapphire, or transferred by wet or dry techniques. The adhesion layer may be Cr, Ti, Ni, etc. deposited by evaporation, sputtering, or other methods. The stressor layer may include Ni, Cr, Fe, Mo, Ti, W, and alloys. In another variation the area to be lifted off may be a device, such as a transistor, light emitting diode, or laser; passive circuit elements, such as capacitor or inductor; or a full circuit formed from the above described materials. SiC, Si, Ge, GaAs, $SiO_2$/Si, quartz are typical substrates for depositing vdW layers on. vdW layers can be transferred to virtually any substrate, including inorganic substrates—oxides, III-V or II-VI semiconductors, and group V semiconductors. The stressor layer and adhesion layer may be the same metals. Some metals are better adhesives like Ti and Cr, and some are better stressors like Ni.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 2A:
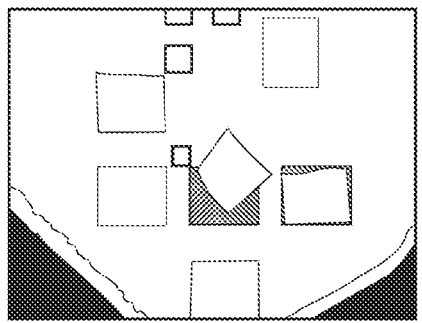
FIGS. 2A-2D present optical images of selective area lift-off.
Figure 2B:
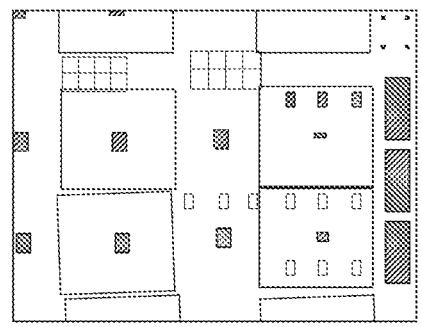
Figure 2C:
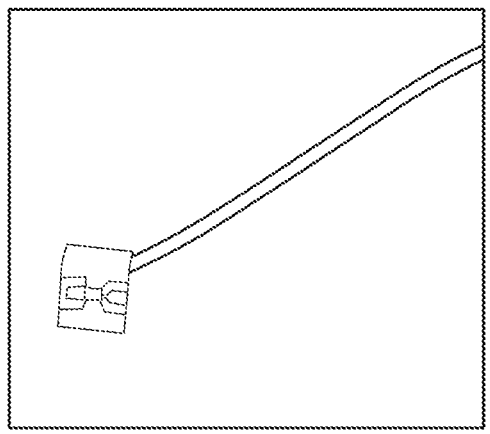
Figure 2D:
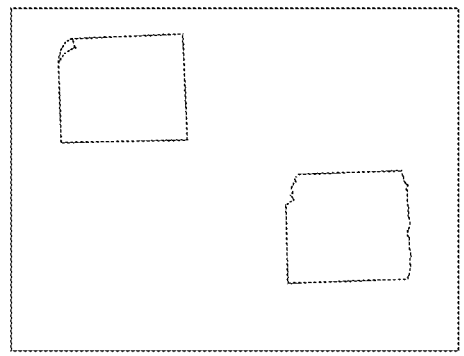

FIGS. 2A-2D present optical images of selected areas of a film lifted from a blanket film. FIG. 2A presents a blanket film over a substrate. The film is scored in several places (see rectangles) so that the film may self-separate from the substrate with the application of stress. FIG. 2B presents several devices on a wafer after crack definition. FIG. 2C presents an isolated film device ready for bonding. FIG. 2D presents two film devices that were lifted off using thermal release tape.

Figure 3A:
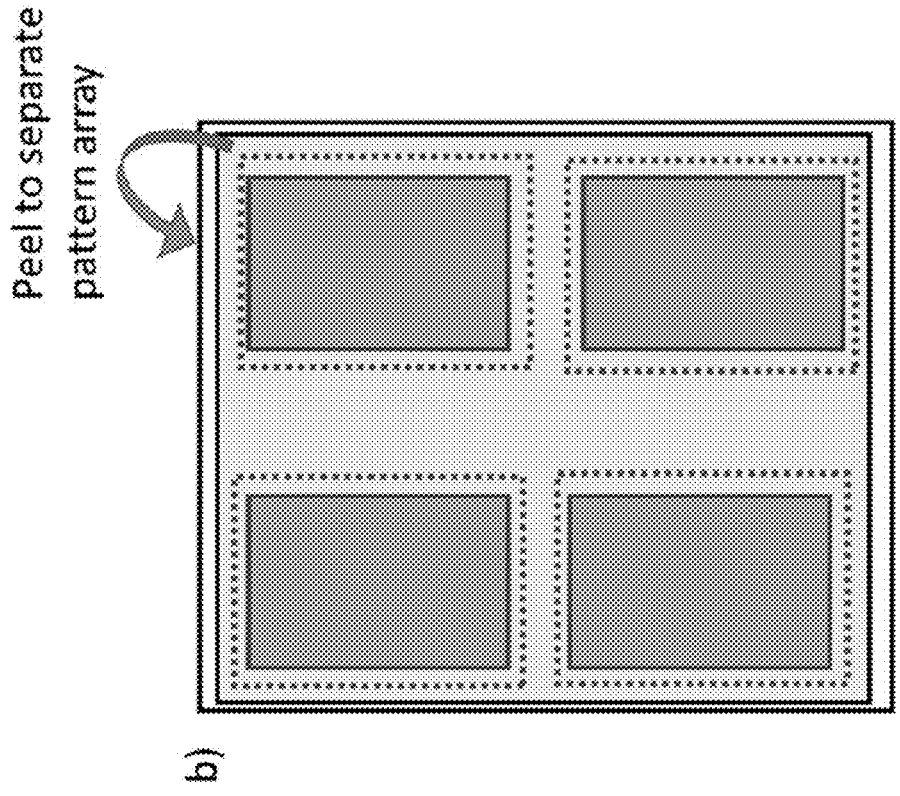
FIGS. 3A-3B present plan view schematics of selective-area lift-off.
Figure 3B:
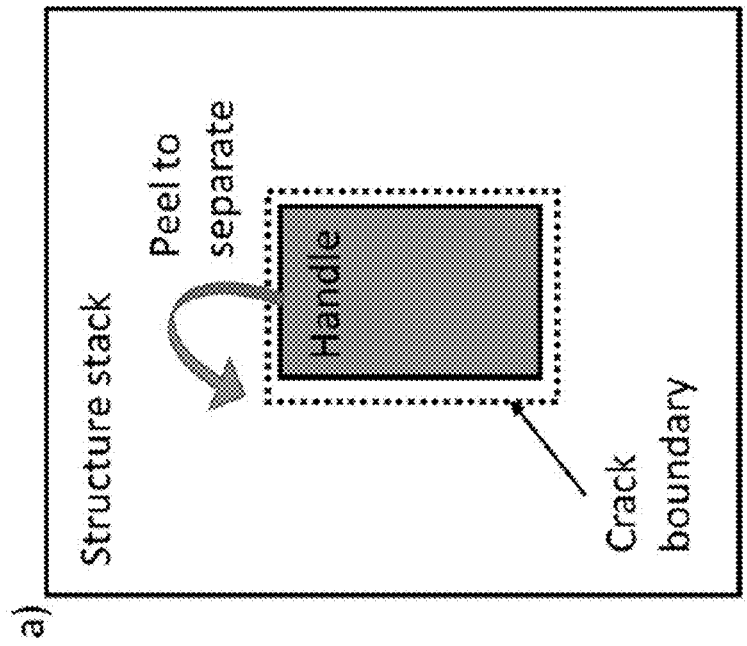

FIG. 3A shows a schematic of the selective area transfer process. On top of the structure described above, thermal release tape was applied as a handle, with the dimensions of the tape corresponding approximately to the dimensions of the area to be separated. Then, to define the boundaries of the selected area, the region around the handle was mechanically scribed (see dotted rectangle) down to the vdW layer to initiate the crack. The area was separated from the substrate by peeling back the handle. In another version, the crack was initiated using a microPREP laser milling tool to define rectangular features, but the shape may be almost any geometry or array of patterned features. The area to be lifted-off may be a few 10s of microns to a full wafer >100 mm in diameter. FIG. 3B shows a schematic for the removal of an array, e.g. 2×2 matrix) of selected areas. The array may be separated as a unit by applying a second handle over the entire region and peeling. In addition to the mechanical and laser methods to define the crack boundary, ion milling or sputtering Ar, Ga, or other ions may be used, which could be defined using a mask. As an alternative, the selected area may be separated without the use of a handle layer. If there is enough force applied by the stressor layer, the area to be lifted will automatically separate once the crack region is defined. The force applied by the stressor layer can be controlled by deposition conditions of stressor layer or thickness. More force will typically induce automatic separation.

Figure 4:
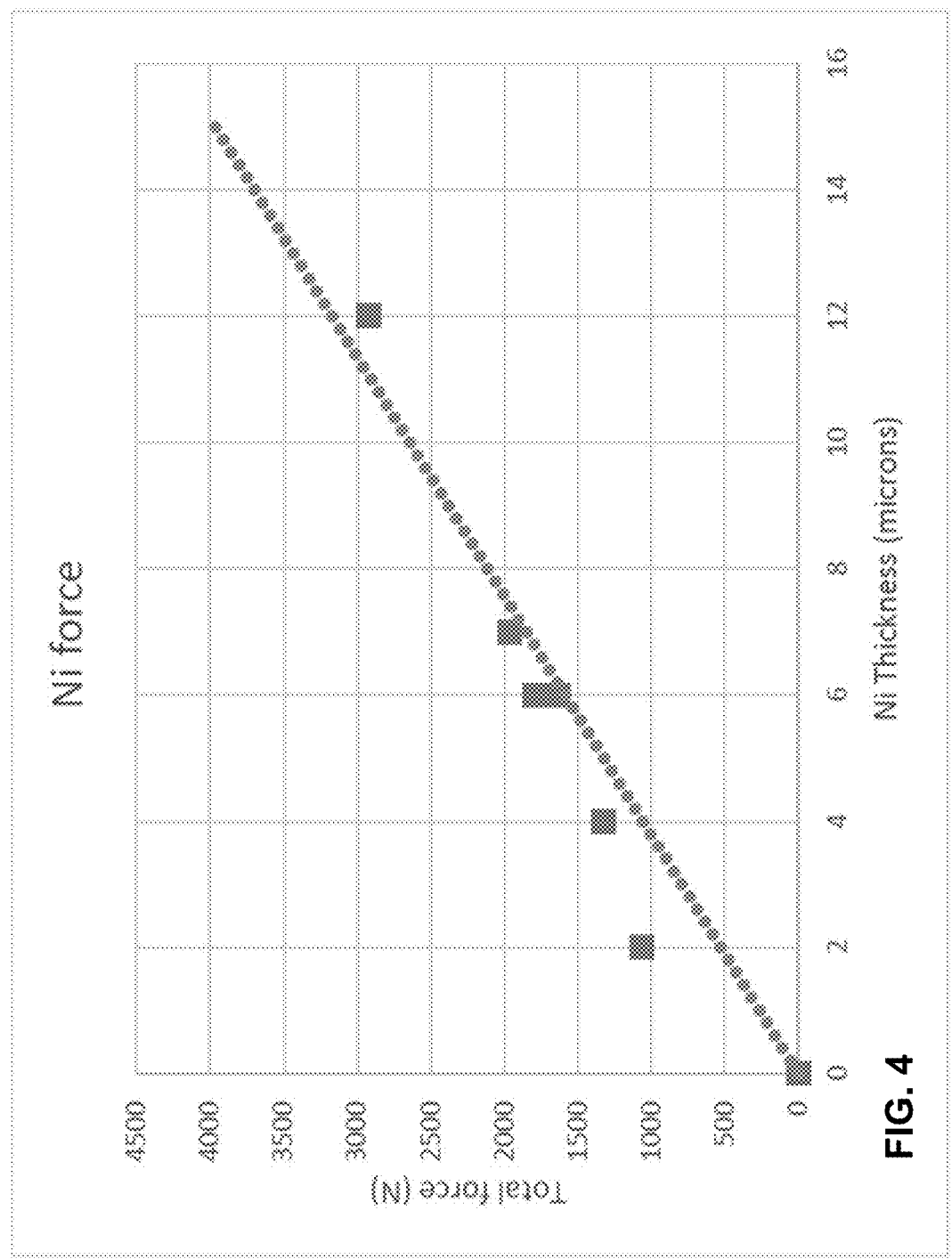
FIG. 4 presents a force vs thickness curve for a sputtered Ni stressor film. The squares are experimentally measured for Ni films on Si.

FIG. 4 is a curve of force applied by the stressor layer, i.e. the stressed metal layer is deposited in a state of tensile stress, as a function of thickness.

ALTERNATIVES

This selective separation scheme may also be applied to materials other than semiconductors, including insulators, dielectrics, and metals. These materials may be epitaxial, single crystalline, polycrystalline, or amorphous. The device or layer could be comprised of a two-dimensional material like graphene, $MoS_2$, etc. that is transferred or grown on top of the vdW buffer. Separation at the vdW buffer requires that the weakest mechanical interaction be in or at the interface with the buffer. As an example, this could be achieved through the morphology of vdW buffer. The vdW layer may be replaced with an embedded spalling layer, which has different mechanical properties, strain, or cleavage planes.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method for making a selective-area lift-off thin film, comprising:
    depositing a van der Waals (vdW) buffer on a substrate, wherein the vdW buffer includes hBN;
    depositing a thin film material or a device structure on the van der Waals buffer;
    depositing an adhesion layer on the thin film material;
    forming a stressor layer on top of the thin film layer;
    bonding a handle layer to the stressor layer; and
    defining a selected area for lift-off by one of laser cutting and mechanical scribing.

2. The method of claim 1, further comprising
    applying a force to the layered structure by one or more of rolling, bending, and shearing.

3. The method of claim 1, wherein the handle layer is a one of a polyimide tape, UV release tape, water- or solvent-soluble tape, Kapton tape, and Scotch tape.

4. The method of claim 1, wherein the stressor layer is a metal film.

5. The method of claim 4, wherein the metal layer is nickel (Ni).

6. The method of claim 1, wherein the thin film material is a device structure.

7. The method of claim 1, wherein the thin film material is one or more of GaN, AlN, InN, GaAs, GaP, and InP.

8. The method of claim 1, wherein the adhesion layer is one or more of Ni, Cr, and Ti.

9. The method of claim 6, wherein the device structure is one or more of a LED, diode, solar-cell, capacitor, inductor, resistor, photonic devices, and wave guides.

10. A selective-area lift-off thin film structure, comprising:
    a van der Waals (vdW) buffer layer on a substrate, wherein the vdW buffer includes hBN;
    a thin film material on the van der Waals layer;
    an adhesion layer on the thin film material;
    a stressor layer on top of the thin film layer; and
    a handle layer to the stressor layer, wherein the handle layer is a one of a polyimide tape, UV release tape, water- or solvent-soluble tape, Kapton tape, and Scotch tape.

* * * * *